United States Patent
Han et al.

(10) Patent No.: US 8,178,973 B2
(45) Date of Patent: May 15, 2012

(54) COPPER WIRE, METHOD FOR FABRICATING THE SAME, AND THIN FILM TRANSISTOR SUBSTRATE WITH THE SAME

(75) Inventors: Gyu Won Han, Gyeonggi-do (KR); Dong Sun Kim, Goyang-si (KR); Won Joon Ho, Cheongju-si (KR); Hee Jung Yang, Yangju-si (KR)

(73) Assignee: LG Display Co., Ltd., Seoul (KR)

( * ) Notice: Subject to any disclaimer, the term of this patent is extended or adjusted under 35 U.S.C. 154(b) by 226 days.

(21) Appl. No.: 12/314,605

(22) Filed: Dec. 12, 2008

(65) Prior Publication Data

US 2009/0166640 A1    Jul. 2, 2009

(30) Foreign Application Priority Data

Dec. 26, 2007 (KR) .......................... 10-2007-0137386

(51) Int. Cl.
*H01L 33/40* (2010.01)

(52) U.S. Cl. .................. 257/751; 257/762; 257/E33.063

(58) Field of Classification Search .................. 257/750, 257/751, 753, 762, E33.063
See application file for complete search history.

(56) References Cited

U.S. PATENT DOCUMENTS

| | | | | |
|---|---|---|---|---|
| 7,061,020 B2* | 6/2006 | Chae | ................ | 257/72 |
| 7,612,451 B2* | 11/2009 | Shih et al. | ................ | 257/751 |
| 2007/0257369 A1* | 11/2007 | Huang | ................ | 257/758 |
| 2008/0149930 A1* | 6/2008 | Lee et al. | ................ | 257/59 |

FOREIGN PATENT DOCUMENTS

JP    02-174145    7/1990

* cited by examiner

*Primary Examiner* — Wensing Kuo
(74) *Attorney, Agent, or Firm* — McKenna Long & Aldridge LLP

(57) ABSTRACT

The present invention relates to a copper wire in a semiconductor device in which a barrier layer is formed for improving adhesion of a copper wire without any additional fabricating step; a method for fabricating the same, and a flat panel display device with the same. The copper wire includes a barrier layer formed on an underlying structure, and a copper conductive layer on the barrier layer, wherein the barrier layer includes at least one of a $Cu_2O$ layer and a $CuO_xN_y$ layer.

1 Claim, 7 Drawing Sheets

COPPER WIRE, METHOD FOR FABRICATING THE SAME, AND THIN FILM TRANSISTOR SUBSTRATE WITH THE SAME

This application claims the benefit of the Patent Korean Application No. 10-2007-137386, filed on Dec. 26, 2007, which is hereby incorporated by reference as if fully set forth herein.

BACKGROUND OF THE INVENTION

1. Field of the Invention

The present invention relates to a copper wire in a semiconductor device, and more particularly, to a copper wire in a semiconductor device in which a barrier layer is formed for improving adhesion of a copper wire without an additional fabricating step; a method for fabricating the same, and a flat panel display device including the same.

2. Discussion of the Related Art

According to development of an information oriented society, fast development of semiconductor devices is progressing for fast storage of large amounts of information. It is a trend that the semiconductor devices are integrated to high device packing densities for storing a large amount of information in a small area.

The semiconductor device is used for driving a flat panel display device which, displays an image, as a general integrated circuit for supplying a signal to the flat panel display device, or as a device for driving a matrix of pixels on the flat panel display device which displays the image directly.

The semiconductor device used in a variety of fields is required to have a reduced area of wire for occupying less area and making fast processing of a large quantity of information. The reduced area of wire and consequential reduction of distance between adjacent patterns, increases a resistance of the wire to cause signal delay and a problem of electron migration in the wire.

In order to solve the above problems, development of a device having a wire of a low resistance is required, and copper Cu which, has a high electric conductivity and a low dielectric constant, is a wire material of low resistance.

However, the copper used as a low resistance wire has a property in which adhesion to a silicon oxide film, silicon nitride film, or glass which is mostly used as an insulating film is poor. Moreover, since the copper has a diffusion coefficient in silicon around 100 times greater than aluminum, a conductive barrier layer is required additionally for improving adhesion to the insulating film and preventing the copper from diffusion.

Though the barrier layer has been formed of material having Ti, TiN, or TaN in the related art, since the material includes metal(s) different from copper, it is required that a fabrication process of the material is performed in a chamber separate from the chamber for depositing the copper. That is, a process for forming the barrier layer becomes complicated.

In order to solve the above problems, a barrier layer of copper nitride is suggested.

Preparation of a Material with an Exact Composition of Copper Nitride, however, is difficult because copper and nitride have poor solubility to each other, $Cu_3N$ is a copper nitride suitable enough to be used as the barrier layer.

Figure 1:
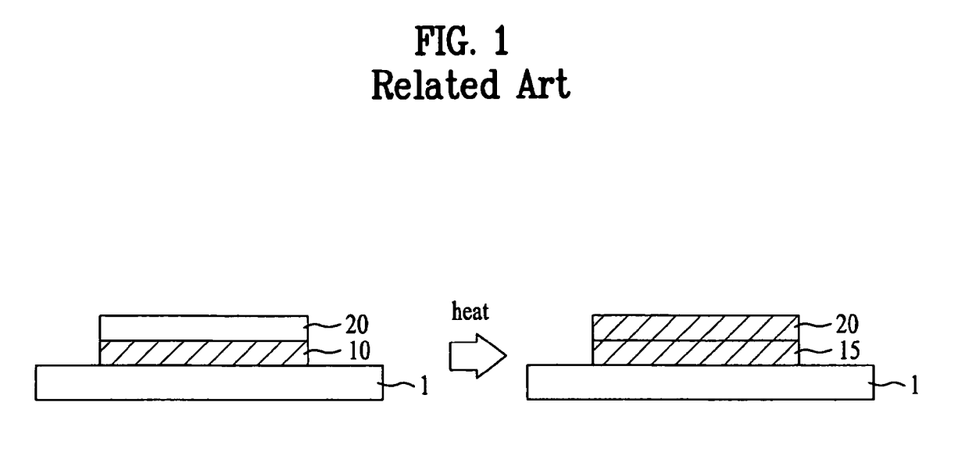
FIG. 1 is a sectional view illustrating a problem of a related art barrier layer.

FIG. 1 illustrates a section of a copper conductive layer 20 of a copper wire formed on a barrier layer 10 of $Cu_3N$ on a substrate 1.

Since $Cu_3N$ has comparably stable properties, the $Cu_3N$ is used for a storage medium of an optical disk. However, since the $Cu_3N$ also has a low thermal stability, if heat is applied to $Cu_3N$ due to temperature rise of the substrate in a fabrication step after formation of the barrier layer, for example, deposition of copper, Cu in $Cu_3N$ is reduced to Cu to form a reduced Cu layer 15 as shown in FIG. 1.

If the $Cu_3N$ is reduced to Cu, the barrier layer can not serve as a barrier layer, causing poor adhesion to an underlying film, and failing to prevent the copper from diffusion.

SUMMARY OF THE INVENTION

Accordingly, the present invention is directed to a copper wire, a method for fabricating the same and a thin film transistor substrate with the same.

An advantage of the present invention is to provide a copper wire and a method for fabricating the same, in which a barrier layer is formed of a material which includes a copper oxide, particularly, $Cu_2O$, or $CuO_xN_y$, for forming a stable barrier layer without addition of a fabrication step, readily.

Additional advantages, and features of the invention will be set forth in the description which follows, and in part will be apparent from the description, or may be learned from practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described herein, a copper wire includes a barrier layer formed on an underlying structure, and a copper conductive layer on the barrier layer, wherein the barrier layer includes at least one of a $Cu_2O$ layer and a $CuO_xN_y$ layer.

In another aspect of the present invention, a method for fabricating a copper wire includes, placing a substrate in a sputtering chamber having a copper target provided therein; forming a Cu2O layer on the substrate by using O2 gas; removing the O2 gas, and forming a copper layer on the Cu2O layer within the same chamber; and patterning the copper layer and the Cu2O layer at the same time to form a copper wire having a stack of multi-layers of the barrier layer and the copper conductive layer.

In another aspect of the present invention, a method for fabricating a copper wire includes placing a substrate in a sputtering chamber having a copper target provided therein; forming a CuOxNy layer on the substrate by using O2 gas and N2 gas together or at least one of NO gas and NO2 gas; removing the gas used when the CuOxNy layer is formed, and forming a copper layer on the CuOxNy layer within the same chamber; and patterning the copper layer and the Cu2O layer at the same time to form a copper wire having a stack of multi-layers of the barrier layer and the copper conductive layer.

In another aspect of the present invention, the copper used as a low resistance wire has a property in which adhesion to a silicon oxide film, silicon nitride film, or glass which is mostly used as an insulating film is poor. Moreover, since the copper has a diffusion coefficient in silicon around 100 times greater than aluminum, a conductive barrier layer is required additionally for improving adhesion to the insulating film and preventing the copper from diffusion.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incor- In the drawings.

DETAILED DESCRIPTION OF THE INVENTION

Reference will now be made in detail to the present invention, examples of which are illustrated in the accompanying drawings. Wherever possible, the same reference numbers will be used throughout the drawings to refer to the same or like parts.

The copper wire of the present invention includes a barrier layer formed on an underlying structure, and a copper conductive layer formed on the barrier layer, wherein the barrier layer is formed of a copper oxide layer of $Cu_2O$, or at least one of $CuO_xN_y$ layers.

A copper wire in accordance with a first preferred embodiment of the present invention will be described with reference to the attached drawing.

Figure 2A:
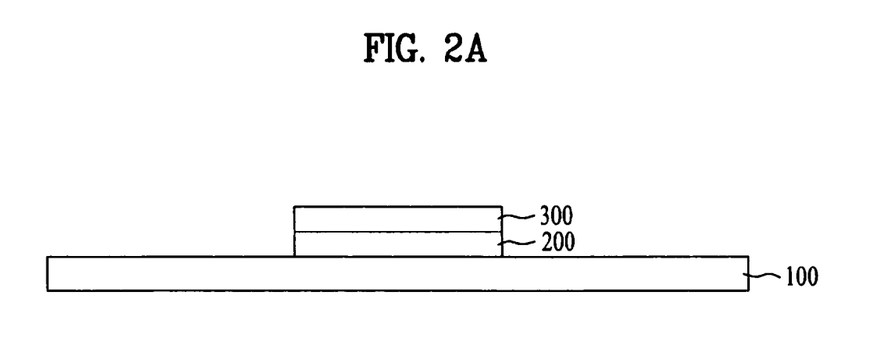
FIG. 2A is a sectional view illustrating a copper wire in accordance with a first preferred embodiment of the present invention.

FIG. 2A is a sectional view illustrating a copper wire in accordance with a first preferred embodiment of the present invention.

Referring to FIG. 2A, the copper wire includes a barrier layer 200 formed on an underlying structure 100, and a copper conductive layer 300 formed on the barrier layer 200, wherein the barrier layer 200 is a copper oxide layer of $Cu_2O$ or a copper oxide layer of a $CuO_xN_y$ layer (Where x and y are positive numerals).

The underlying structure 100 may be, for an example, a substrate, such as a glass substrate or a silicon substrate, or an insulating film, such as a silicon nitride film or a silicon oxide film.

The barrier layer 200 is the copper oxide layer of $Cu_2O$ or preferably of a $CuO_xN_y$ layer.

The barrier layer 200 has a thermal stability such that the characteristic of the barrier layer is not reduced by heat applied to the substrate in a later fabrication step, i.e., an effect in which the copper is prevented from diffusing into an insulating film and adhesion of the copper is improved.

A copper wire in accordance with a second preferred embodiment of the present invention will be described with reference to the attached drawing.

Figure 2B:
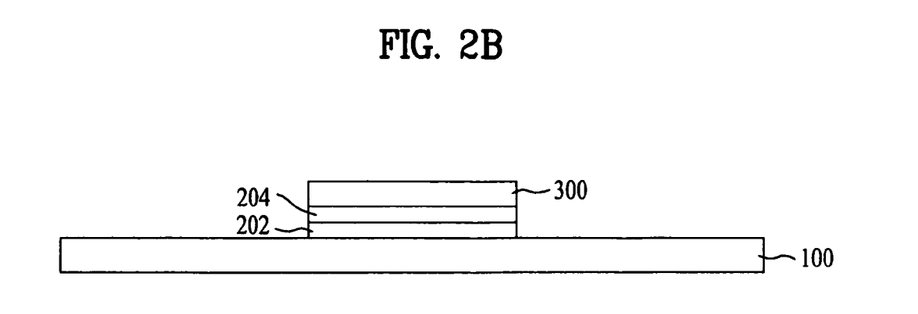
FIG. 2B is a sectional view illustrating a copper wire in accordance with a second preferred embodiment of the present invention.

FIG. 2B is a sectional view illustrating a copper wire in accordance with a second preferred embodiment of the present invention.

Referring to FIG. 2B, the copper wire includes a first barrier layer 202 formed on an underlying structure 100, a second barrier layer 204 formed on the first barrier layer 202, and a copper conductive layer 300 formed on the second barrier layer 204.

The underlying structure 100 may be, for an example, a substrate, such as a glass substrate or a silicon substrate, or an insulating film, such as a silicon nitride film or a silicon oxide film.

Though the first barrier layer 202 and the second barrier layer 204 may be copper oxide layers of $CuO_xN_y$ or $Cu_2O$, preferably the first barrier layer 202 is formed of $CuO_xN_y$ and the second barrier layer 204 is formed of $Cu_2O$.

A characteristic of an interface between the $CuO_xN_y$ and the insulating film is more stable than characteristic of an interface between the $Cu_2O$ and the insulating film, thus is preferable that the first barrier layer 202 under the second barrier layer 204 is formed of $CuO_xN_y$.

It is preferable that the barrier layer of $CuO_xN_y$ is deposited to a thickness of 50~1000.

The copper wire having double barrier layers is more stable.

A thin film transistor substrate in accordance with a preferred embodiment of the present invention will be described.

Figure 3A:
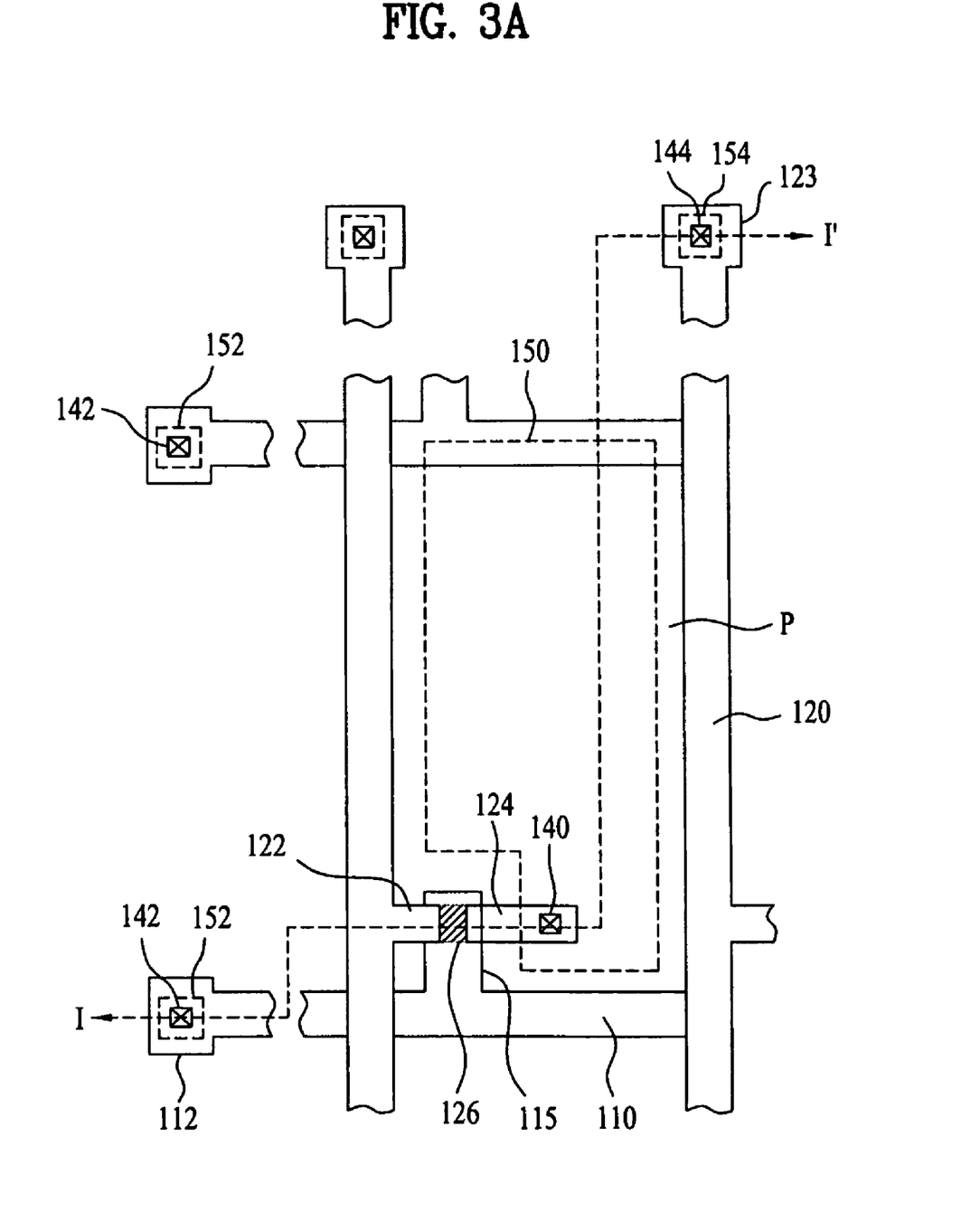
FIG. 3A is a plan view illustrating a thin film transistor substrate in accordance with a preferred embodiment of the present invention.
Figure 3B:
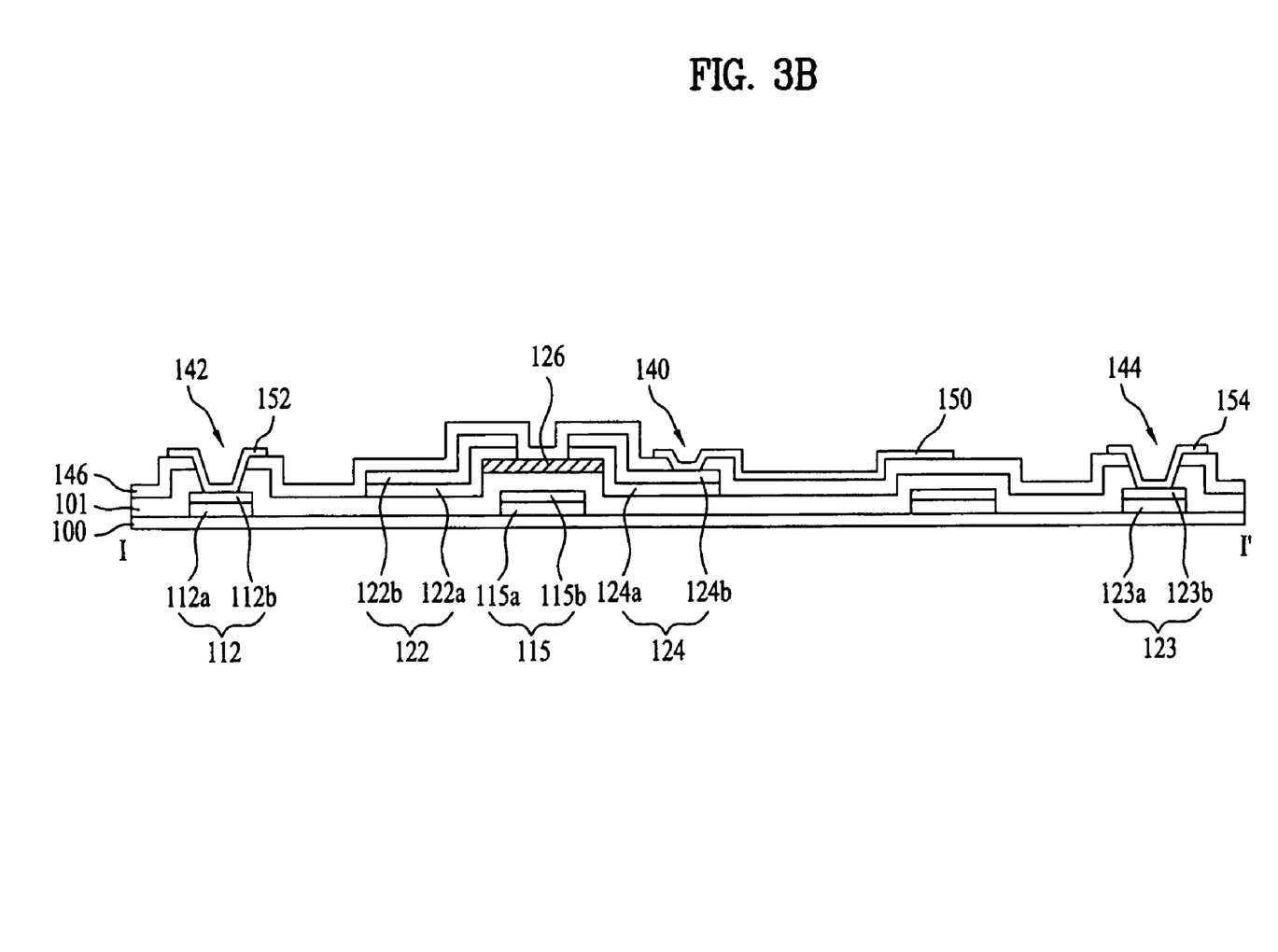
FIG. 3B is a sectional view across a line I-I' in FIG. 3A.

FIG. 3A is a plan view illustrating a thin film transistor substrate in accordance with a preferred embodiment of the present invention, and FIG. 3B is a sectional view across a line I-I' in FIG. 3A.

Referring to FIGS. 3A and 3B, the thin film transistor substrate includes gate lines 110 formed on a substrate 100, data lines 120 formed perpendicular to the gate lines 110 between the gate lines 110 and a gate insulating film 101 to define pixel regions P, thin film transistors formed at regions where the gate lines and the data lines cross respectively, and pixel electrodes 150 formed at the pixel regions connected to the thin film transistors, respectively.

The gate line 110 has a gate pad 112 at one end of it for receiving a gate signal from an outside of a device, and the data line 120 has a data pad 123 at one end of it for receiving a data signal from an outside of the device.

The thin film transistor includes a gate electrode 115 branched from the gate line, a gate insulating film 101 formed to cover the gate electrode 115, a semiconductor layer 126 formed on the gate insulating film opposite to the gate electrode 115, a source electrode 122 formed at one end of the semiconductor layer 126 branched from the data line 120, and a drain electrode 124 opposite to the source electrode 122.

The pixel electrode 150 is connected to the thin film transistor through a first contact hole 140 formed to expose the drain electrode 124 as a portion of a protective film 146 formed on an entire surface of the substrate including the source electrode 122, the drain electrode 124 and the data line 120 for protecting the thin film transistor is removed.

Preferably, the pixel electrode 150 is formed of a transparent conductive material, such as Indium-Tin oxide (ITO).

Though FIG. 3A illustrates the pixel electrode 150 formed to have a region overlapped with the gate line of a prior stage for forming a storage capacitor, there is also a case when the pixel electrode 150 is formed to overlap with a common line to form the storage capacitor.

On the gate pad 112, there is a gate pad electrode 152 formed to cover a second contact hole 142 having the gate insulating film 101 and the protective film 146 removed therefrom to expose the gate pad 122.

On the data pad 123, there is a data pad electrode 154 formed to cover a third contact hole 144 having a portion of the protective film 146 removed therefrom to expose the data pad.

At least one of the gate line 110 and the data line 120 is constructed of the copper wire of the embodiment of the present invention.

FIG. 3B illustrate a case when both the gate line and the data line are constructed of double structure of the barrier layer and the copper conductive layer.

Referring to FIG. 3B, in the thin film transistor of the embodiment of the present invention, the gate pad 112 has a double structure of a gate pad barrier layer 112a and a copper conductive layer 112b on the gate pad barrier layer 112a. Though not shown, the gate line 110 has a double structure of a gate line barrier layer and a copper conductive layer, and the gate electrode 115 has a double structure of a gate electrode barrier layer 115a and a copper conductive layer 115b.

The data pad 123 has a double structure of a data pad barrier layer 123a and a copper conductive layer 123 on the data pad barrier layer 123a, the source electrode 122 has a double structure of a source electrode barrier layer 122a and a copper conductive layer 122b, and the drain electrode 124 has a double structure of a drain electrode barrier layer 124a and a copper conductive layer 124b.

That is, in the thin film transistor, the gate line 110 has a double structure of the gate line barrier layer and the copper conductive layer, and the data line 120 has a double structure of the data line barrier layer and the copper conductive layer.

Though FIG. 3 illustrates both the gate line 110 and the data line 120 have double structures, one of the gate line 110 and the data line 120 may have the double structure.

Moreover, in the thin film transistor substrate of the embodiment of the present invention, of the gate line 110 and the data line 120, the line (the gate line 110 or data line 120) having the double structure requires no capping layer. That is, because a temperature of the substrate is not elevated over 320° C. in a process of fabricating a flat panel display device, no additional capping layer will be required.

The thin film transistor substrate of the embodiment of the present invention includes the gate lines and the data lines at least one of which has a stack of multi-layers of the barrier layer and the copper conductive layer, wherein the barrier layer is formed of $Cu_2O$, or preferably at least one of $CuO_xN_y$ to form a copper wire in which a barrier layer has a stable structure which is not reduced by heat.

A method for fabricating a copper wire in accordance with a first preferred embodiment of the present invention will be described.

Figure 4A:
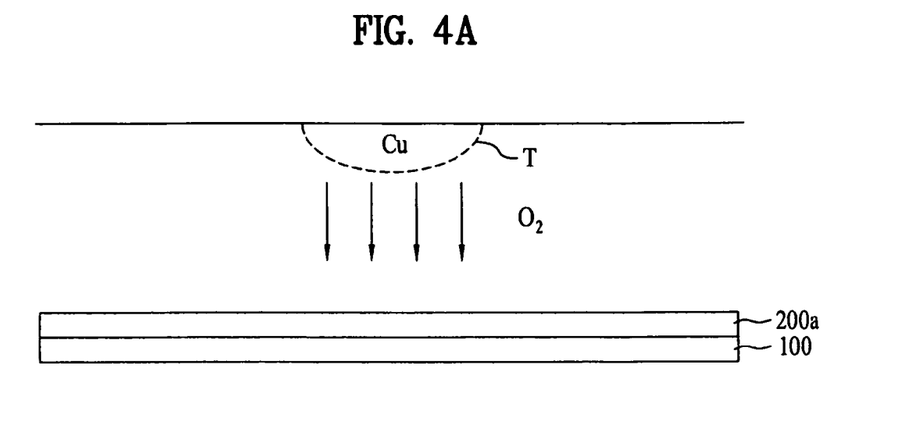
FIGS. 4A to 4C are sectional views illustrating a method for fabricating a copper wire in accordance with a first preferred embodiment of the present invention.
Figure 4B:
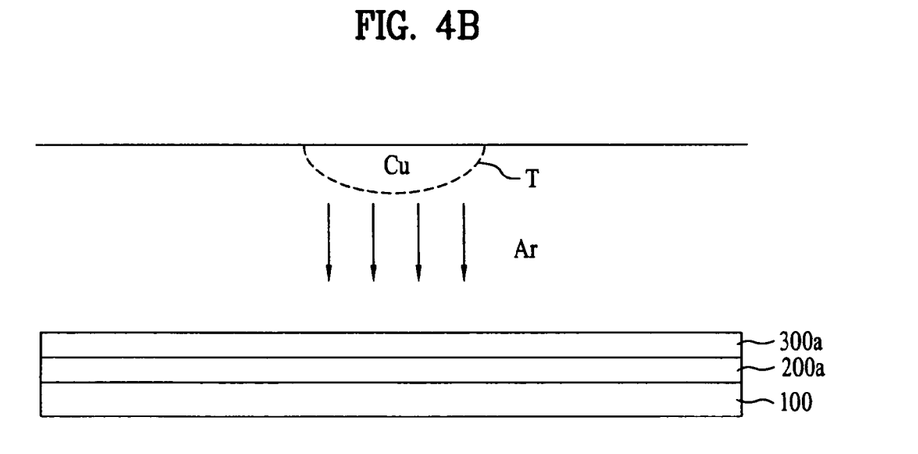
Figure 4C:
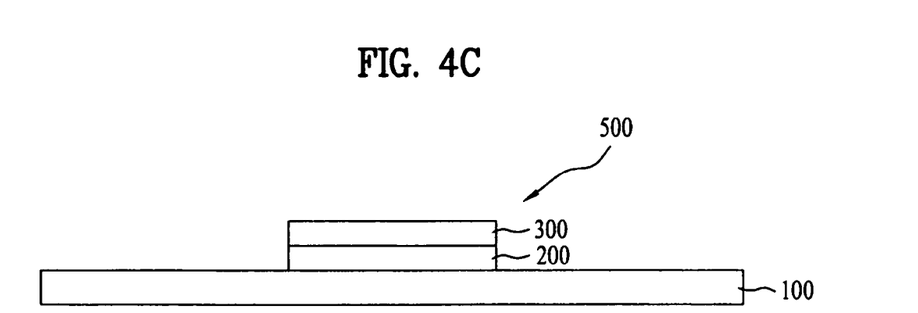

FIGS. 4A to 4C are sectional views illustrating a method for fabricating a copper wire in accordance with a first preferred embodiment of the present invention to be performed in an enclosed chamber by reactive sputtering.

Referring to FIG. 4A, after placing a substrate 100 in a chamber having a copper target T provided therein, the copper target T is sputtered to form a barrier material layer 200a on the substrate 100. In this instance, only $O_2$ gas is used, and it is not required to use Ar gas together with the $O_2$ gas.

In this instance, the chamber is set to have an inside pressure of below 2.0 Pa, and an inside temperature of below 400° C. Particularly, because, material other than $Cu_2O$ can be formed depending on the pressure, it is required to give attention to the pressure.

The barrier material layer 200a formed thus is a $Cu_2O$ layer.

Referring to FIG. 4B, after removing the $O_2$ gas from the chamber, the copper target T is sputtered in an environment where only Ar gas present, to form a copper layer 300a on the barrier material layer 200a.

Then, referring to FIG. 4C, after taking the substrate 100 out of the chamber, the barrier material layer 200a and the copper layer 300a is patterned, to form a copper wire having a barrier layer 200 and a copper conductive layer 300.

The method for fabricating a copper wire in accordance with a first preferred embodiment of the present invention forms the barrier layer 200 and the copper conductive layer 300 within the same chamber having the copper target T provided therein by changing the kind of gas applied at a time. Whereas, the related art's method for fabricating a copper wire forms the barrier layer and the copper conductive layer in different chambers. A stable barrier layer is formed by the instant invention, which simplifies the fabrication process and does not easily reduce the barrier layer by heat.

A method for fabricating a copper wire in accordance with a second preferred embodiment of the present invention will be described.

Figure 5A:
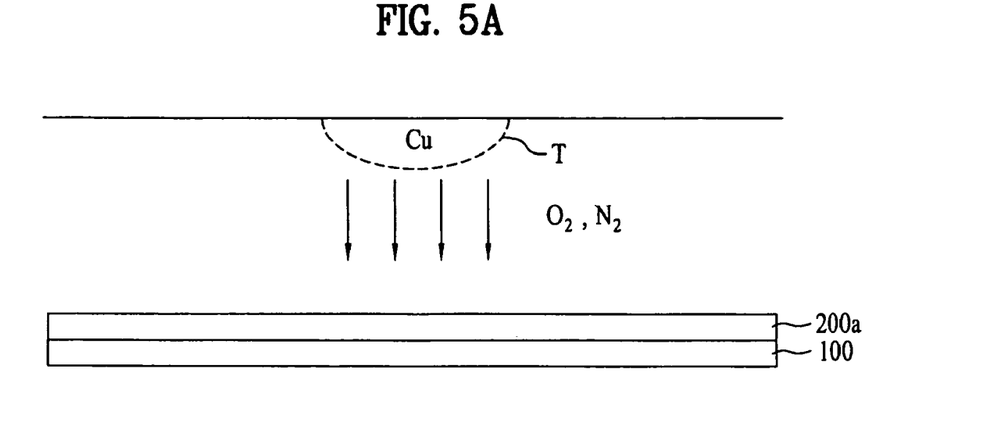
FIGS. 5A to 5C are sectional views illustrating a method for fabricating a copper wire in accordance with a second preferred embodiment of the present invention.
Figure 5B:
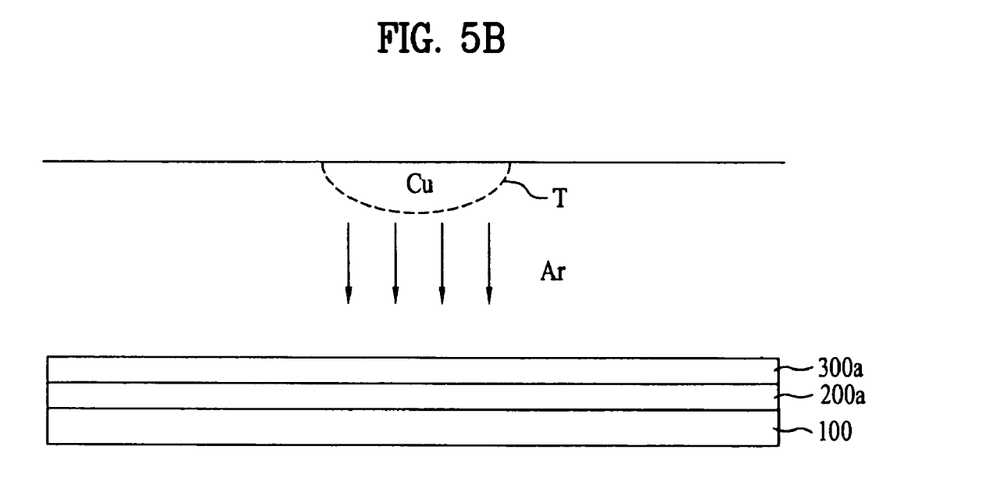
Figure 5C:
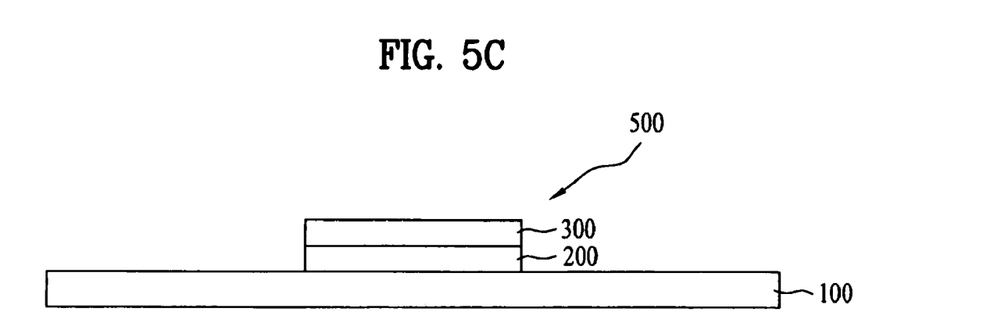

FIGS. 5A to 5C are sectional views illustrating a method for fabricating a copper wire in accordance with a second preferred embodiment of the present invention to be also performed in an enclosed chamber by reactive sputtering.

Referring to FIG. 5A, after placing a substrate 100 in a chamber having a copper target T provided therein, the copper target T is sputtered to form a $CuO_xN_y$ layer 200a on the substrate 100. In this instance, $N_2$ gas and $O_2$ gas are used together, and Ar gas may be added thereto.

In this instance, a flow rate ratio of the $N_2$ gas to the $O_2$ gas $N_2/O_2$ is set to be in a range of 0.1~1, and the chamber is set to have an inside temperature of below 400° C.

Other than the method of using the $N_2$ gas and the $O_2$ gas together, it may be possible to use a gas which can form oxygen and nitrogen based radical at a time, such as NO gas or $NO_2$ gas, using either of the gases to form the $CuO_xN_y$ layer 200a.

Referring to FIG. 5B, after removing the $N_2$ the $O_2$ gas from the chamber, the copper target T is sputtered in an environment where only Ar gas present, to form a copper layer 300a on the $CuO_xN_y$ layer 200a.

Then, referring to FIG. 5C, after taking the substrate 100 out of the chamber, the $CuO_xN_y$ layer 200a and the copper layer 300a is patterned, to form a copper wire having a barrier layer 200 and a copper conductive layer 300.

The method for fabricating a copper wire in accordance with a second preferred embodiment of the present invention forms the barrier layer 200 and the copper conductive layer 300 within the same chamber having the copper target provided therein by changing the kind of gas applied at a time. A stable barrier layer of $CuO_xN_y$ layer is formed which simplifies the fabrication process and does not easily reduce the barrier layer by heat.

Though not shown, a $Cu_2O$ layer may be formed with $O_2$ gas on the $CuO_xN_y$ layer 200a before forming the copper layer 300a.

Figure 6A:
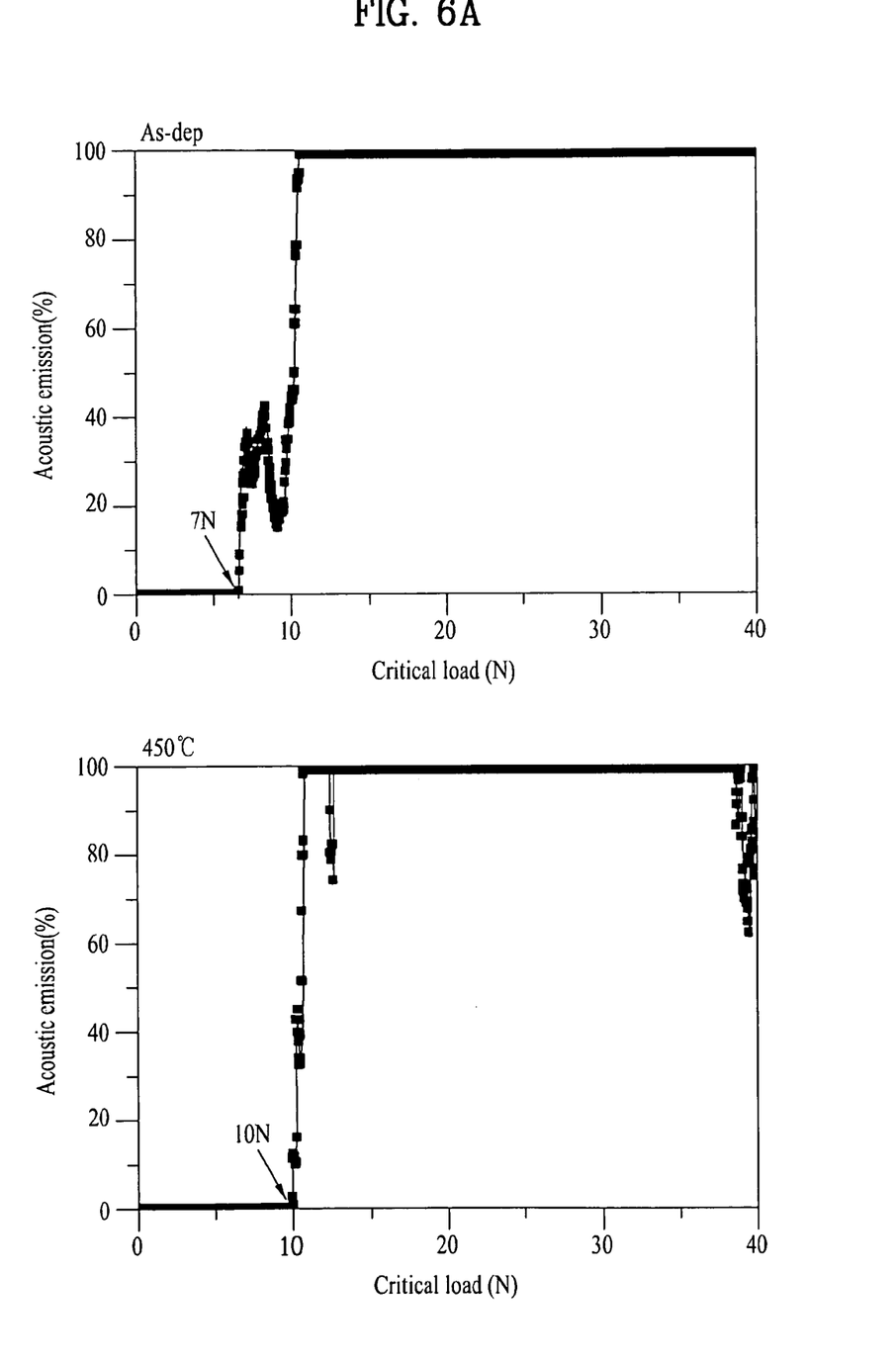
FIG. 6A is a graph illustrating a physical property of a barrier layer of $Cu_3N$ formed by using $N_2$ gas only.
Figure 6B:
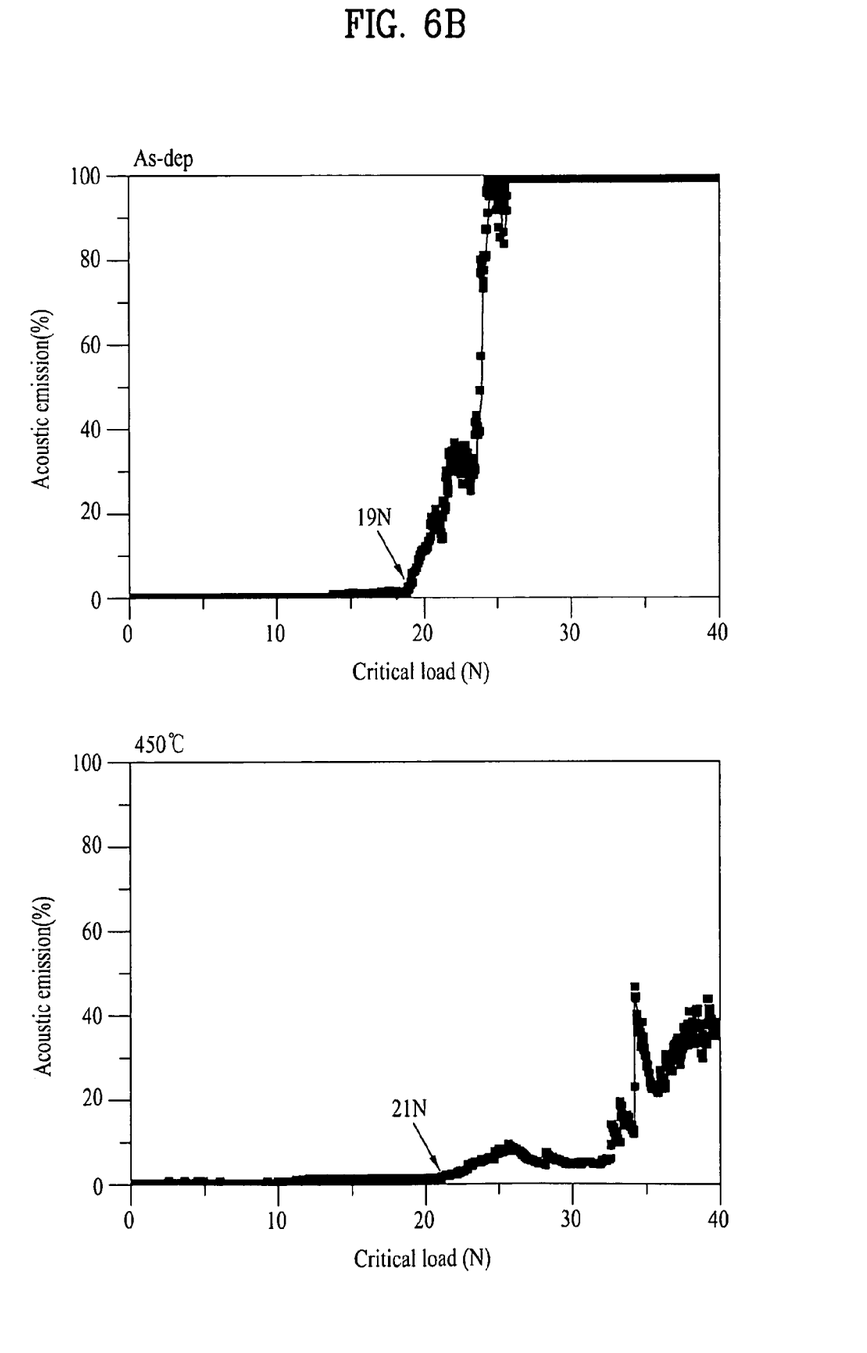
FIG. 6B is a graph illustrating a physical property of a barrier layer of $CuO_xN_y$.

FIG. 6A is a graph illustrating a physical property of a barrier layer of $Cu_3N$ formed by using $N_2$ gas only, and FIG. 6B is a graph illustrating a physical property of a barrier layer of $CuO_xN_y$.

Each of the graphs shows measurement of acoustic emission from scratching of the barrier layer formed on a bare glass substrates with a tip by applying a force varying from 0N to 40N. That is, adhesion of a deposited film is evaluated by using a sharp change of the acoustic emission, if the film is peeled in the middle of the scratching.

As illustrated in FIG. 6A, when the barrier layer of $Cu_3N$ is formed by using $N_2$ gas only, the peeling occurs when a force of 7N is applied right after deposition of the film (refer to a left side), and the peeling occurs when a force of 10N is applied at a temperature of 450° C. (refer to a right side).

In comparison to the above, as can be known from FIG. 6B, with the barrier layer of $CuO_xN_y$, the peeling occurs when a force of 19N is applied right after deposition of the film (refer to a left side), and the peeling occurs when a force of 21N is applied at a temperature of 450° C. (refer to a right side).

Accordingly, when the barrier layer of $CuO_xN_y$ is formed according to the present invention, a more reliable copper wire is formed than the case when the barrier layer of $Cu_3N$ is formed by using $N_2$ gas only like the related art.

As has been described, the copper wire, the method for fabricating the same, and the flat panel display device with the same of the present invention have the following advantages.

The formation of the barrier layer and the copper conductive layer within the same chamber having the copper target provided therein by changing the kind of the gas applied at a time permits the formation of a stable barrier layer, which simplifies the fabrication process and does not easily reduce the barrier layer by heat.

Though a copper nitride barrier layer is reduced by heat easily, and copper oxide barrier layers except $Cu_2O$ show poor film characteristic depending on a deposition condition, the present invention can provide a copper wire having a barrier layer which is stable to heat and has an excellent film characteristic.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor substrate comprising:
a plurality of gate lines formed on a substrate, and a plurality of data lines formed perpendicular to the gate lines between the gate lines and a gate insulating film to define pixel regions;
a plurality of thin film transistors formed at regions where the gate lines and the data lines cross respectively, and
a plurality of pixel electrodes formed at the pixel regions connected to the thin film transistors respectively,
wherein one of the gate lines and the data lines is constructed of a copper wire;
wherein another one of the gate lines and the data lines is not constructed of the copper wire;
wherein the copper wire includes a barrier layer formed on an underlying structure and a copper conductive layer on the barrier layer, wherein the barrier layer includes at least one of a $Cu_2O$ layer and a $CuO_xN_y$ layer;
wherein x and y are positive numerals;
wherein the barrier layer is comprised of a first barrier layer and a second barrier layer;
wherein the first barrier layer is formed between the underlying structure and the second barrier layer;
wherein the second barrier layer is formed between the first barrier layer and the copper conductive layer;
wherein the first barrier layer is a $CuO_xN_y$ layer;
wherein the second barrier layer is a $Cu_2O$ layer;
wherein a thickness of the first barrier layer is between about 50 to about 1000 Å;
wherein the one of the gate lines and the data lines constructed of the copper wire has no overlying separate capping layer;
wherein the other one of the gate lines and the data lines not constructed of the copper wire has an overlying separate capping layer.

* * * * *